United States Patent
Daeumer et al.

(10) Patent No.: US 11,431,154 B2
(45) Date of Patent: Aug. 30, 2022

(54) TRIGGERABLE SPARK GAP, SWITCHING CIRCUIT HAVING A TRIGGERABLE SPARK GAP, AND PROCESS FOR MANUFACTURING A TRIGGERABLE SPARK GAP

(71) Applicant: TDK Electronics AG, Munich (DE)

(72) Inventors: Wolfgang Daeumer, Zeuthen (DE); Michael Mewes, Berlin (DE); Zhipeng Fang, Xiaogan (CN)

(73) Assignee: TDK ELECTRONICS AG, Munich (DE)

( * ) Notice: Subject to any disclaimer, the term of this patent is extended or adjusted under 35 U.S.C. 154(b) by 188 days.

(21) Appl. No.: 16/762,855

(22) PCT Filed: Nov. 8, 2018

(86) PCT No.: PCT/EP2018/080621
§ 371 (c)(1),
(2) Date: May 8, 2020

(87) PCT Pub. No.: WO2019/092108
PCT Pub. Date: May 16, 2019

(65) Prior Publication Data
US 2020/0287357 A1 Sep. 10, 2020

(30) Foreign Application Priority Data
Nov. 10, 2017 (DE) .......................... 102017126371.3

(51) Int. Cl.
*H01T 1/24* (2006.01)
*H01T 1/22* (2006.01)
(Continued)

(52) U.S. Cl.
CPC ................. *H01T 1/24* (2013.01); *H01T 1/22* (2013.01); *H01T 2/02* (2013.01); *H01T 21/00* (2013.01)

(58) Field of Classification Search
CPC .... H01T 1/22; H01T 1/24; H01T 2/02; H01T 4/12; H01T 15/00; H01T 21/00; H03K 3/537
(Continued)

(56) References Cited

U.S. PATENT DOCUMENTS 2,400,456 A * 5/1946 Haine ....................... H01T 2/02
331/127
4,433,354 A 2/1984 Lange et al.
(Continued)

FOREIGN PATENT DOCUMENTS

| CN | 201274375 Y | 7/2009 |
|---|---|---|
| CN | 202856146 U | 4/2013 |

(Continued)

*Primary Examiner* — Kevin J Comber
(74) *Attorney, Agent, or Firm* — Slater Matsil, LLP

(57) ABSTRACT

A triggerable spark gap, a switching circuit and a method for manufacturing a triggerable spark gap are disclosed. In an embodiment, a triggerable spark gap includes a trigger electrode, an adjacent electrode at the trigger electrode, a counter electrode and a gap between the counter electrode and the adjacent electrode, wherein a distance between the trigger electrode and the adjacent electrode is less than a distance between the trigger electrode and the counter electrode, wherein the distance between the trigger electrode and the counter electrode is less than a distance between the adjacent electrode and the counter electrode, wherein the counter electrode and/or the adjacent electrode includes a first phase including a first material and a second phase (Continued)

including a second material, and wherein the second material has a lower electron work function than the first material.

13 Claims, 1 Drawing Sheet

(51) Int. Cl.
 *H01T 2/02* (2006.01)
 *H01T 21/00* (2006.01)
(58) Field of Classification Search
 USPC .......................................................... 307/109
 See application file for complete search history.

(56) References Cited

U.S. PATENT DOCUMENTS

| | | | |
|---|---|---|---|
| 5,151,630 | A | 9/1992 | Boy et al. |
| 5,892,648 | A | 4/1999 | Bobert et al. |
| 10,186,843 | B2 | 1/2019 | Daeumer et al. |
| 2006/0209485 | A1* | 9/2006 | Imai ................ H01T 4/12 361/120 |

FOREIGN PATENT DOCUMENTS

| | | | |
|---|---|---|---|
| CN | 103928843 | A | 7/2014 |
| DE | 1763559 | A1 | 10/1971 |
| DE | 2742502 | A1 | 3/1979 |
| DE | 3100924 | A1 | 8/1982 |
| DE | 3723571 | A1 | 1/1989 |
| DE | 273566 | A3 | 11/1989 |
| DE | 19632417 | C1 | 5/1998 |
| DE | 102004006988 | A1 | 6/2005 |
| DE | 102015114846 | A1 | 3/2017 |
| EP | 0056282 | A1 | 7/1982 |
| EP | 0425736 | A1 | 5/1991 |
| KR | 20110000001 | A * | 1/2011 |
| SU | 1081718 | A2 | 3/1984 |

* cited by examiner

TRIGGERABLE SPARK GAP, SWITCHING CIRCUIT HAVING A TRIGGERABLE SPARK GAP, AND PROCESS FOR MANUFACTURING A TRIGGERABLE SPARK GAP

This patent application is a national phase filing under section 371 of PCT/EP2018/080621, filed Nov. 8, 2018, which claims the priority of German patent application 102017126371.3, filed Nov. 10, 2017, each of which is incorporated herein by reference in its entirety.

TECHNICAL FIELD

The invention relates to triggerable spark gaps having a longer service life, to circuits having such spark gaps and to methods for producing such spark gaps.

BACKGROUND

Triggerable spark gaps are suitable as switches for switching high-voltage and high-current pulses. To this end, a spark gap has a trigger electrode, an adjacent electrode arranged in the vicinity thereof, and a counter electrode. A voltage can be applied between the adjacent electrode and the counter electrode. By means of a signal applied to the trigger electrode, for example a particular electrical potential, a high-voltage discharge can be initiated (triggered) between the adjacent electrode and the counter electrode.

Spark gaps are, for example, known from German Patent Application Publication No. DE 102015114846 A1.

One measure of the service life of a spark gap is, for example, the number of switching processes which can be initiated reliably before errors occur during the switching. Material transport from the electrodes to wall regions, which are intended to DC-isolate the electrodes, lead to a general reduction of the insulation between the electrodes, so that the spark gap can no longer be operated reliably beyond a critical insulation resistance.

Known measures for extending the service life comprise, for example, larger dimensioning of the spark gap. In this way, the material removed from the electrodes is distributed over a larger area, so that a critical insulation can be maintained for a long time. A further measure consists, for example, in reducing the main discharge gap or increasing the length of the switching spark gap. It is furthermore possible to shield the wall regions better by a larger electrode diameter, or to introduce undercuts into the topology.

A problem with known measures for extending the service life is, however, the fact that the space requirement of the spark gap is increased and/or more material is needed for producing the spark gap. The former is unfavourable since small external dimensions are always preferred by manufacturers of electrical components having spark gaps. The latter is unfavourable since material costs and production costs thereby increase.

SUMMARY

Embodiments provide triggerable spark gaps having an extended service life, which can be produced with small dimensions and the production outlay and production costs of which in relation to an extension of the service life are reduced to a minimum.

The triggerable spark gap comprises a trigger electrode, an adjacent electrode and a counter electrode. The adjacent electrode is arranged at the trigger electrode, i.e., in the vicinity of the trigger electrode in relation to the distance between the electrode and the counter electrode. The triggerable spark gap furthermore comprises a gap between the counter electrode and the adjacent electrode. The distance between the trigger electrode and the adjacent electrode is less than the distance between the trigger electrode and the counter electrode. The distance between the trigger electrode and the counter electrode is less than the distance between the adjacent electrode and the counter electrode. The counter electrode and/or the trigger electrode comprise a first phase consisting of a first material and a second phase consisting of a second material. The second material has a lower electron work function than the first material.

The trigger electrode is preferably the electrode by means of which a switching process of the triggerable spark gap can be initiated. By initiating (triggering) a switching process, an electrical discharge is induced across the gap between the counter electrode and the adjacent electrode.

The effect of the second material will be explained below with reference to the example of the counter electrode. The same applies for the corresponding two-phase structure of the adjacent electrode.

The presence of a phase boundary inside the counter electrode, i.e., a phase electrode between the first material of the counter electrode and the second material of the counter electrode, changes the electrochemical and electrophysical properties inside the spark gap in such a way that a significant increase in the service life of the spark gap can be obtained. With a suitable material selection, it is possible to at least double the service life of the triggerable spark gap.

It is possible for the first material to be a material known for use as a counter electrode. Materials with high melting points which are electrically conductive may be envisioned for the first material. Materials which have a high melting point, a minimum electrical conductivity and furthermore also a good thermal conductivity are particularly preferred.

Molybdenum, tungsten and intermetallic compounds with lanthanum may therefore be envisioned as the first material of the counter electrode and/or of the adjacent electrode. Furthermore, copper and chromium are also suitable as constituents of the first material and of the second material.

As the second material of the second phase of the counter electrode, materials which reduce the contact resistance of the electrode and/or the arc voltage may be envisioned in particular. For this, vitreous alkali metal and alkaline-earth metal components are found to be a favourable choice for the electron emission.

It has been discovered that a reduction of the arc burning voltage reduces the power dissipation inside the spark gap. The power dissipation in turn has an effect on the extent of the material transport from the electrodes to the walls. A reduced arc burning voltage therefore leads indirectly to reduced material transport and therefore to an improvement in the insulation between the electrodes.

It is furthermore preferred for the second material to have a low evaporation rate.

However, it has been found that materials having an evaporation rate that is higher than the evaporation rate of conventional counter electrode materials nevertheless surprisingly allow the construction of spark gaps having an extended service life.

A material which has been produced by heating from a glass paste has been found to be a suitable material for the second material of the counter electrode.

It is therefore possible for the first material to comprise molybdenum, tungsten, chromium, copper or lanthanum or consist of molybdenum, tungsten, chromium, copper or lanthanum, and for the second material to comprise a heated glass paste or vitreous alkali metal or alkaline-earth metal compounds.

This material may be applied onto the first material as a coating. A coating which has a high melting point and relatively low evaporation rates is therefore provided. Furthermore, this material combination makes it possible to produce an electrode-emitting surface of the counter electrode, which reduces the self-breakdown voltage in the gap between the adjacent electrode and the counter electrode. In order to achieve the same self-breakdown voltage or a surface of the counter electrode, the gas fill pressure inside the triggerable spark gap may be increased. By a collision cross section, increased with an increased gas fill pressure, for evaporating particles in the gas, the condensation of material on the inner wall between the electrodes is reduced. Furthermore, particles of the second material are preferably not as electrically conductive as the first material, which in conventional triggerable spark gaps would short-circuit the electrodes after reaching a critical activation number.

Because of these relationships, it is possible to significantly increase, for example 2 double, the possible number of pulses for the triggerable spark gap.

The second material may in this case been produced by heating from the material of a glass paste. The glass paste is therefore a heated glass paste, which may comprise sodium silicate, a sheet glass, cerium oxide, yttrium oxide, titanium and water. The water may this case be used as a carrier medium in order to provide the other constituents in the form of a paste. The water may, for example, to a large extent be removed by heating after the paste has been applied onto the first material.

It is possible for the paste contain sodium silicate with a mass fraction of between 50% and 70%. The mass fraction of the sheet glass may be between 15% and 27%. The mass fraction of cerium oxide may be between 10% and 20%. The mass fraction of yttrium oxide in the paste may be between 1% and 5%. The paste may contain titanium in a mass fraction of between 0.5% and 1.7%. Water may make up the remainder or a part of the remainder of the composition of the paste.

In one embodiment of the paste, the paste contains sodium silicate with a mass fraction of 60%, a sheet glass with a mass fraction of 21%, cerium oxide with a mass fraction of 15%, yttrium oxide with a mass fraction of 3.2%, and metallic titanium with a mass fraction of 1.1%.

It is possible for the gap between the trigger electrode and the counter electrode to have a width B, with 5 mm≤B≤15 mm.

It is possible for the second material to be arranged between the first material and the gap, and to have a thickness D, 50 μm≤D≤200 μm.

The arrangement of the second material is in this case preferably such that the second material covers the first material of the counter electrode at least at the positions which are intended for the current transport between the electrodes during activation of the spark gap.

The trigger electrode, the adjacent electrode and the counter electrode may be arranged at least partially in a hermetically sealed cavity.

The adjacent electrode may be joined or connected to a first external contact. The counter electrode may be joined and/or connected to a second external electrical contact. The trigger electrode may be joined or connected to a third external contact.

It is possible for the cavity to comprise much and/or a noble gas.

The pressure inside the cavity may be between 500 mbar and 2 bar.

It is possible to select the distance between the adjacent electrode and the counter electrode on the one hand, the fill pressure on the other hand, and furthermore the composition of the second material, in such a way that the switchable spark gap is a self-breakdown voltage of between 10 kV and 35 kV, for example 20 kV. The gap between the adjacent electrode and the counter electrode may in this case have a width of 10 mm. The thickness of the layer of the second material of the counter electrode may be selected in the interval between 50 μm and 200 μm, for example, at the value of 100 μm.

The operating voltage range of the triggerable spark gap may be between 7.5 kV and 22 kV. The critical potential for initiating the spark gap, which is applied to the trigger electrode, may, for example, be selected in such a way that a voltage increase from 1 to 15 kV relative to the adjacent electrode is obtained.

The second material may be formed as a thick-film coating on the first material of the counter electrode. The second material may, for example, be applied in the form of a paste with a brush or by means of a similar method, and subsequently dried. The drying of the base material may, for example, be carried out with an infrared lamp.

Preferably, the second material is applied onto the first material before the counter electrode is connected, for example soldered, to other constituents of the triggerable spark gap.

The trigger double spark gap may comprise a closed opening. Through the opening, the cavity of the spark gap may be filled with a preferred gas or a preferred gas mixture. Subsequently, the opening is closed in such a way that hermetic sealing of the cavity is obtained.

Conventionally constructed triggerable spark gaps may have a service life of about two million switching processes. With comparable geometrical dimensions of the external shape of the spark gap and of the essential internal structure of the spark gap, the service life may be increased to 4 million activations by the above-described structure of the counter electrode.

The glow burning voltage may be in the range of about 1000 V. The are voltage may be about 100 V.

The triggerable spark gap may be used in a circuiting conjunction with an electrical load and an energy storage unit, for example a capacitor.

Correspondingly, a circuit comprises an electrical load, a triggerable spark gap as described above, and a capacitor. The triggerable spark gap is connected in series with the load. The capacitor is in parallel with the series circuit.

The capacitor is preferably high-voltage-proof, and is intended to be charged with an external DC (direct-voltage) high voltage. The high voltage may in this case be equal to the operating voltage of the spark gap at the value of about 7.5 kV to 22 kV. The capacitor may have a capacitance of between 10 nF and 1300 nF, for example 100 nF.

The load in the circuit may, for example, be a generator for generating acoustic shock waves. By means of the spark gap and the capacitor, for example, devices may thus be for treating kidney stones or gallstones, and the like.

To this end, the spark gap DC-isolates the load from at least one electrode of the capacitor. Preferably when the capacitor is filled with the desired electrical charge, the spark gap is initiated by applying the corresponding signal to the trigger electrode, and the electrical energy of the capacitor is released to the load.

High-voltage-proof film capacitors, which can release their energy to the load in a very short-lasting pulse, for example within 50 ns, may in this case preferably be envisioned as the capacitor.

A method for producing a triggerable spark gap may comprise the following steps: providing a trigger electrode and materials for an adjacent electrode and/or a counter electrode, providing a first material, providing a second material, which has a lower electron work function than the first material, and forming an adjacent electrode and/or a counter electrode by coating the first material with the second material.

The second material may in this case be provided in the form of an aqueous paste. The paste may be applied onto the first material by means of a thick-film method.

It is possible for the paste to be dried after application.

It is possible for the first material to be soldered after drying. The second material has a glass component which bonds the second material firmly to the first material by the soldering.

The soldering temperature may in this case be between 850 and 1000° C., for example 920° C.

The temperature which the second material is exposed during the soldering is also correspondingly high. The glass component of the paste therefore forms a mechanically stable bond at the phase boundary with the first material. A corresponding heat treatment also subsequently protects the first material and the second material well against oxidation. So to speak, a passivation layer is formed on the otherwise exposed material surface, which is sensitive to corrosion, of the first material.

The arrangement of a second material to reduce the arc voltage is not restricted to the counter electrode. It is also possible to coat the adjacent electrode correspondingly and to omit a coating of the counter electrode.

It is also possible to provide a corresponding material only on the adjacent electrode, or to provide both the adjacent electrode and the counter electrode with a coating.

BRIEF DESCRIPTION OF THE DRAWINGS

Central functional principles and details of preferred embodiments will be explained in more detail with the aid of the appended schematic figures, in which.

DETAILED DESCRIPTION OF ILLUSTRATIVE EMBODIMENTS

Figure 1:
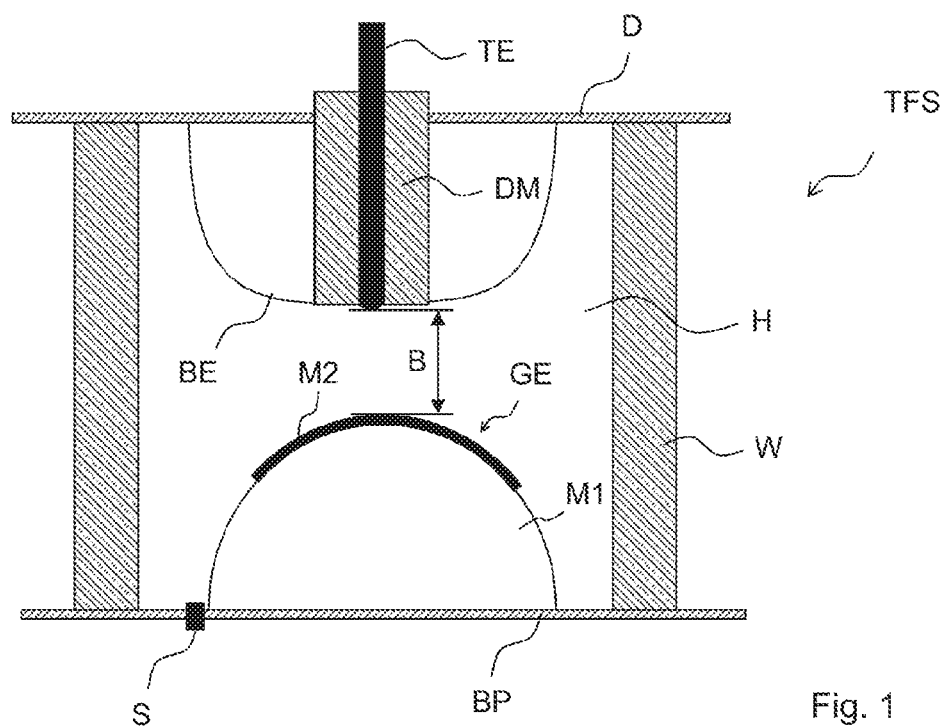
FIG. 1 shows a possible arrangement of the constituents of the spark gap.

FIG. 1 shows a possible structure of the triggerable spark gap TFS in a cross-sectional view. The adjacent electrode BE and an opposite electrode GE face one another in a cavity H. The adjacent electrode is arranged in the vicinity of a trigger electrode TE. It is possible for the adjacent electrode BE to be configured substantially rotationally symmetrically and to have a recess internally. The trigger electrode TE is arranged inside the recess and is separated and insulated from the material of the adjacent electrode BE by a dielectric material DM. There is a gap between the adjacent electrode BE and the opposite electrode GE, and between the trigger electrode TE and the opposite electrode GE. Preferably, the trigger electrode TE protrudes in the direction of the opposite electrode GE beyond the dimensions of the adjacent electrode BE. This makes it easier for the trigger electrode TE to induce an electrical discharge between the adjacent electrode and the opposite electrode GE when a corresponding signal is applied to the trigger electrode TE and a corresponding high voltage is set up between the adjacent electrode BE and the opposite electrode GE.

Correspondingly, the distance B between the trigger electrode TE and the opposite electrode GE is preferably less than the distance between the adjacent electrode BE and the opposite electrode GE. The distance between the trigger electrode TE and the adjacent electrode BE is preferably less than the distance between the trigger electrode TE and the opposite electrode GE.

The cavity H is preferably filled with a gas or gas mixture which is dielectric in the nonactivated state, which is introduced through an opening that is closed by the stopper S after production.

The opposite electrode GE has at least two constituents with a phase boundary between them. A first phase is formed by a first material M1. A second phase is formed by a second material M2. A phase boundary is correspondingly formed between the first material M1 and the second material M2.

The second material M2 is preferably arranged as a so-called thick film on the first material M1. The second material M2 is preferably arranged at those positions on the upper side of the first material M1 which are intended for charge transport during activation.

The second material M2 reduces the arc voltage of the spark gap. The second material M2 represents an electrode activation compound, which allows electrons to escape more readily than the first material M1. The power dissipation of the triggerable electrode is therefore reduced, and the material transport from the counter electrode GE to one or more side walls W is therefore also reduced, so that the DC isolation of the opposite electrodes is reliably ensured even after a large number of activations.

The wall or the walls W preferably consist of a dielectric material, for example a ceramic. Top cover D, on which the material of the adjacent electrode BE is fastened, and a base plate BP, on which the first material M1 is arranged, may be electrically conductive and, for example, may comprise a metal or an alloy and represent the external terminals besides the terminal of the trigger electrode TE.

Figure 2:
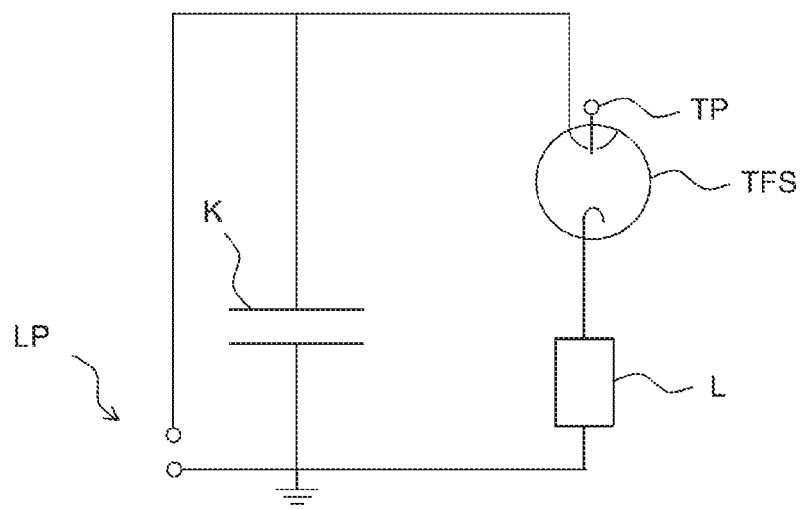
FIG. 2 shows a possible equivalent circuit of an application of the spark gap.

FIG. 2 shows one possible application of the triggerable spark gap TFS in a circuit. The triggerable spark gap TFS is connected in series with a load L. The series circuit of the load L and the triggerable spark gap TFS is connected in parallel with a capacitor K. Via a charge port LP, the capacitor may have a high voltage applied to it and be charged with corresponding charge. Via a trigger port TP, which is connected to the trigger electrode TE of the charge port, activation of the spark gap can be initiated. In this case, the triggerable spark gap becomes electrically conductive and the capacitor K releases its electrical energy in a short pulse with a high achievable current, for example a few kiloamperes, to the load.

One of the electrodes of the spark gap may be connected to a reference potential, for example ground.

The triggerable spark gap, the circuit having the triggerable spark gap, and the method for producing a triggerable spark gap are not restricted to the embodiments presented. Spark gaps having further constituents, for example, elements to improve the insulation between the adjacent electrode and the counter electrode, circuits having additional circuit elements, and methods having additional method steps are likewise included.

The invention claimed is:

1. A triggerable spark gap comprising:
a trigger electrode;
an adjacent electrode at the trigger electrode;
a counter electrode; and
a gap between the counter electrode and the adjacent electrode,
wherein a distance between the trigger electrode and the adjacent electrode is less than a distance between the trigger electrode and the counter electrode,
wherein the distance between the trigger electrode and the counter electrode is less than a distance between the adjacent electrode and the counter electrode,
wherein the counter electrode and/or the adjacent electrode comprises a first phase comprising a first material and a second phase comprising a second material,
wherein the second material has a lower electron work function than the first material,
wherein the first material comprises molybdenum, tungsten, chromium, copper or lanthanum,
wherein the second material comprises a glass paste, and
wherein the glass paste is a paste containing sodium silicate with a mass fraction of between 50% and 70%, a sheet glass with a mass fraction of between 10% and 20%, yttrium oxide with a mass fraction of between 1% and 5%, titanium with a mass fraction of between 1% and 5%, and water with a mass fraction of between 0.5% and 1.7%.

2. The triggerable spark gap according to claim 1, wherein the gap between the trigger electrode and the counter electrode has a width B, with 5 mm≤B≤15 mm.

3. The triggerable spark gap according to claim 1, wherein the second material is arranged between the first material and the gap, and has a thickness D, with 50 mm≤D≤200 mm.

4. The triggerable spark gap according to claim 1, wherein the trigger electrode, the adjacent electrode and the counter electrode are at least partially arranged in a hermetically sealed cavity.

5. The triggerable spark gap according to claim 4, wherein the cavity comprises nitrogen and/or a noble gas.

6. A circuit comprising:
an electrical load;
the triggerable spark gap according to claim 1, which is connected in series with the load; and
a capacitor connected in parallel with the load and the spark gap.

7. A method for producing a triggerable spark gap, the method comprising:
providing a trigger electrode;
forming an adjacent electrode and/or a counter electrode by coating a first material with a second material,
wherein the second material is provided in form of an aqueous paste and applied onto the first material by a thick-film method;
drying the paste after applying the paste; and
sintering the first material after drying, wherein the second material has a glass component which bonds the second material firmly to the first material by the sintering,
wherein the heated glass paste is a heated paste containing sodium silicate with a mass fraction of between 50% and 70%, a sheet glass with a mass fraction of between 10% and 20%, yttrium oxide with a mass fraction of between 1% and 5%, titanium with a mass fraction of between 1% and 5%, and water with a mass fraction of between 0.5% and 1.7%.

8. A triggerable spark gap comprising:
a trigger electrode;
an adjacent electrode at the trigger electrode;
a counter electrode; and
a gap between the counter electrode and the adjacent electrode,
wherein the counter electrode comprises a first phase comprising a first material and a second phase comprising a second material,
wherein the first material comprises molybdenum, tungsten, chromium, copper or lanthanum, wherein the second material comprises a glass paste, and
wherein the glass paste is a paste containing sodium silicate with a mass fraction of between 50% and 70%, a sheet glass with a mass fraction of between 10% and 20%, yttrium oxide with a mass fraction of between 1% and 5%, titanium with a mass fraction of between 1% and 5%, and water with a mass fraction of between 0.5% and 1.7%.

9. The triggerable spark gap according to claim 8, wherein the gap between the trigger electrode and the counter electrode has a width B, with 5 mm≤B≤15 mm.

10. The triggerable spark gap according to claim 8, wherein the second material is arranged between the first material and the gap, and has a thickness D, with 50 mm≤D≤200 mm.

11. The triggerable spark gap according to claim 8, wherein the trigger electrode, the adjacent electrode and the counter electrode are at least partially arranged in a hermetically sealed cavity.

12. The triggerable spark gap according to claim 11, wherein the cavity comprises nitrogen and/or a noble gas.

13. A circuit comprising:
an electrical load;
the triggerable spark gap according to claim 8, which is connected in series with the load; and
a capacitor connected in parallel with the load and the spark gap.

* * * * *